United States Patent
Keyes

(10) Patent No.: US 12,078,486 B1
(45) Date of Patent: Sep. 3, 2024

(54) NAVIGATION WITH MAGNETIC FIELD SENSORS

(71) Applicant: Honeywell International Inc., Charlotte, NC (US)

(72) Inventor: Sally Ann Keyes, Minneapolis, MN (US)

(73) Assignee: Honeywell International Inc., Charlotte, NC (US)

( * ) Notice: Subject to any disclaimer, the term of this patent is extended or adjusted under 35 U.S.C. 154(b) by 91 days.

(21) Appl. No.: 17/443,632

(22) Filed: Jul. 27, 2021

Related U.S. Application Data

(60) Provisional application No. 63/134,443, filed on Jan. 6, 2021.

(51) Int. Cl.
*G01C 21/08* (2006.01)
*G01C 21/16* (2006.01)

(52) U.S. Cl.
CPC .......... *G01C 21/165* (2013.01); *G01C 21/08* (2013.01)

(58) Field of Classification Search
CPC .............................. G01C 21/165; G01C 21/08
See application file for complete search history.

(56) References Cited

U.S. PATENT DOCUMENTS

| | | | |
|---|---|---|---|
| 5,339,684 A | 8/1994 | Jircitano et al. | |
| 2016/0109233 A1* | 4/2016 | Morrison | G01C 9/005 |
| | | | 701/4 |
| 2016/0187142 A1* | 6/2016 | Larsen | G01P 15/14 |
| | | | 701/500 |
| 2016/0349026 A1 | 12/2016 | Fairfax et al. | |
| 2017/0074660 A1 | 3/2017 | Gann et al. | |
| 2017/0075020 A1 | 3/2017 | Gann et al. | |
| 2019/0302276 A1 | 10/2019 | Sandford et al. | |

(Continued)

FOREIGN PATENT DOCUMENTS

| | | |
|---|---|---|
| CN | 108037658 A | 5/2018 |
| FR | 3050524 A1 | 10/2017 |

OTHER PUBLICATIONS

Moryl et al., "The Universal Gravity Module for Enhanced Submarine Navigation", Position Location and Navigation Symposium, 1998, pp. 1 through 8, IEEE.

(Continued)

*Primary Examiner* — Vivek D Koppikar
*Assistant Examiner* — Jeffrey R Chalhoub
(74) *Attorney, Agent, or Firm* — Riley S. Balling

(57) ABSTRACT

Systems and methods for navigation with magnetic field sensors are provided. For example, a system includes a magnetic gradient sensor that measures a magnetic gradient. The system also includes one or more inertial sensors that provide inertial measurements. Additionally, the system includes a magnetic field sensor that measures magnetic fields. Further, the system includes one or more processors that execute computer-readable instructions that direct the one or more processors to estimate a magnetic field based on the measured magnetic gradient and a velocity estimate from the inertial measurements. The computer-readable instructions also direct the one or more processors to calculate an error for the magnetic field and other navigation parameters using an additional magnetic field measurement from the magnetic field sensor.

18 Claims, 4 Drawing Sheets

(56) References Cited

U.S. PATENT DOCUMENTS

2020/0408527 A1\* 12/2020 Vissiere ............... G01C 21/005
2021/0215484 A1     7/2021 Keyes

OTHER PUBLICATIONS

European Patent Office, "Extended European Search Report from EP Application No. 22150212.3", from Foreign Counterpart to U.S. Appl. No. 17/443,632, filed Jun. 13, 2022, pp. 1 through 9, Published: EP.

Zmitri et al., "Magnetic Field Gradient-Based EKF for Velocity Estimation in Indoor Navigation", Sensors 2020, 20, 5726, Published Oct. 9, 2020, pp. 1 through 17.

European Patent Office, "Communication pursuant to Article 94(3)EPC", dated Jul. 10, 2024, from EP Application No. 22150212.3, from Foreign Counterpart to U.S. Appl. No. 17/443,632, pp. 1 through 5, Published: EP.

\* cited by examiner

NAVIGATION WITH MAGNETIC FIELD SENSORS

CROSS REFERENCE TO RELATED APPLICATIONS

This application claims the benefit of U.S. Provisional Patent Application Ser. No. 63/134,443 entitled "NAVIGATION WITH MAGNETOMETER AND MAGNETIC GRADIENT SENSOR" filed on Jan. 6, 2021, which is incorporated herein by reference in its entirety.

BACKGROUND

Many vehicles rely on navigation systems to provide navigation solutions. These navigation solutions can describe the position, velocity, and orientation of a moving vehicle. Accordingly, vehicle navigation systems are equipped with various sensors that provide information that the navigation systems use to calculate the navigation solutions. One sensor, or source of information, includes a receiver that receives signals from global navigation satellite systems (GNSS). However, the vehicles may be in an environment having limited GNSS measurement availability. Also, the navigation system may receive signals from malicious sources intended to interfere with or spoof authentic GNSS signals. When GNSS measurements are unavailable or unreliable, navigation systems frequently use measurements from other navigation information sources to determine the navigation solution. These sources include inertial measurement units, altimeters, velocimeters, among other sources of navigation information. Notwithstanding the benefits provided by the additional sources, other navigation information sources are subject to various shortcomings.

SUMMARY

Systems and methods for navigation with magnetic field sensors are provided. For example, a system includes a magnetic gradient sensor that measures a magnetic gradient. The system also includes one or more inertial sensors that provide inertial measurements. Additionally, the system includes a magnetic field sensor that measures magnetic fields. Further, the system includes one or more processors that execute computer-readable instructions that direct the one or more processors to estimate a magnetic field based on the measured magnetic gradient and a velocity estimate from the inertial measurements. The computer-readable instructions also direct the one or more processors to calculate an error for the magnetic field and other navigation parameters using an additional magnetic field measurement from the magnetic field sensor.

DRAWINGS

Drawings accompany this description and depict only some embodiments associated with the appended claims. Thus, the described and depicted embodiments should not be considered limiting in scope. The accompanying drawings and specification describe the exemplary embodiments, and features thereof, with additional specificity and detail, in which:

Figure 1:
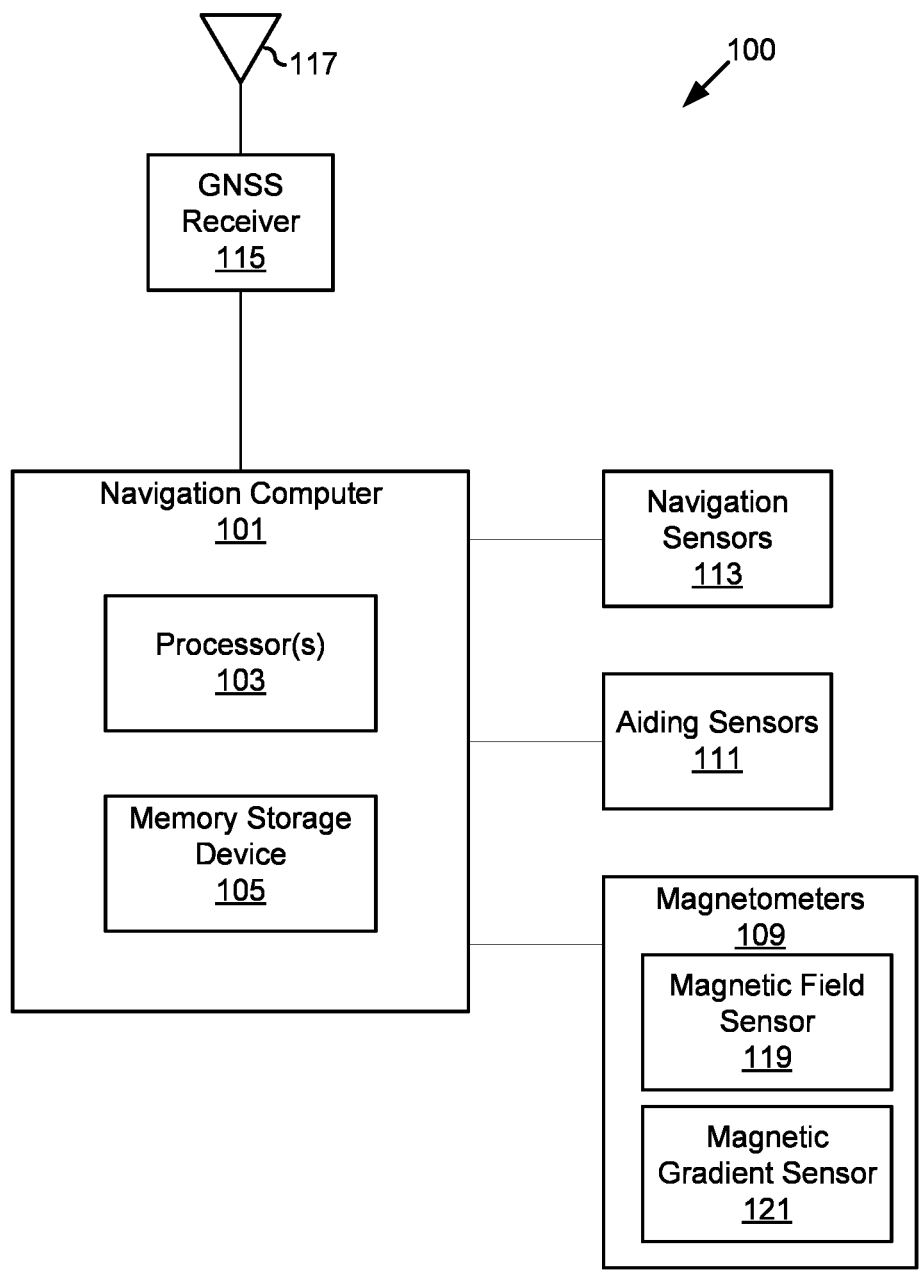
FIG. 1 is a block diagram illustrating an exemplary system for performing navigation with a magnetometer and magnetic gradient sensor according to an aspect of the present disclosure.

In accordance with common practice, the various described features are not drawn to scale but are drawn to emphasize specific features relevant to the example embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made.

This specification describes embodiments that provide navigation using measurements provided by a magnetometer and magnetic gradient sensor. For example, navigation systems described herein include a magnetic gradient sensor that periodically measures magnetic gradients over a particular area. These navigation systems may include a magnetometer that is part of or separate from the magnetic gradient sensor for measuring magnetic fields. Additionally, the navigation systems may estimate the local magnetic field based on the measured magnetic gradient, an estimated velocity, and the measured initial magnetic field. The navigation systems then take an additional measurement of the magnetic field to update the estimated local magnetic field. As described below, updating the estimated local magnetic field with the measured magnetic field reduces position drift and functions as a bound for velocity errors.

Magnetic anomaly-aided navigation is a promising navigation technique in GNSS-denied and GNSS-contested environments. Typically, magnetic anomaly-aided navigation acquires navigation information by comparing information in magnetic anomaly maps with magnetic field measurements of the navigation system's environment. The comparison of the measurements against the maps may provide navigation information that includes position and velocity estimates. However, making magnetic anomaly maps is difficult because of the resources needed to make the maps. Because of the difficulty entailed in making magnetic anomaly maps, few magnetic anomaly maps are available with sufficient resolution for navigation. Additionally, magnetic anomaly maps potentially include misunderstood or vague errors, adding to the difficulty of using information from magnetic anomaly maps in navigation algorithms.

In certain embodiments, a navigation system may use magnetic gradient and magnetic field measurements to acquire navigation information without relying on magnetic anomaly maps. Further, the navigation system may use the magnetic gradient and field measurements in conjunction with inertial sensor data. For example, the navigation system uses inertial sensor data and magnetic gradient measurements to calculate a set of navigation states that includes a magnetic field estimate. In some implementations, the navigation system estimates a change in the magnetic field based on the magnetic gradient measurements and velocity estimates. Then, the navigation system executes a filter that receives a magnetic field measurement and the estimated magnetic field as inputs. With the magnetic field measurements, the filter can update the state of the magnetic field. As the magnetic field estimate was calculated based on the velocity estimate, the updated state of the magnetic field also functions as a bound for velocity errors and reduces position drift.

FIG. 1 is a block diagram of a navigation system 100 that uses magnetic gradient and magnetic field measurements when calculating navigation solutions. The navigation system 100 may be mounted to a vehicle to provide strapdown navigation. The vehicle may be an aircraft, sea craft, spacecraft, train, automobile, or other type and combination of vehicles. Alternatively, the navigation system 100 may be on or form part of a movable object, such as a phone, personal electronics, land surveying equipment, or other objects capable of moving or being moved from one location to another. Additionally, the navigation system 100 may acquire navigation information from one or more different sources. To handle the navigation information from the various sources, the navigation system 100 may include a navigation computer 101. The navigation computer 101 includes at least one processor 103 and at least one memory storage device 105.

In certain embodiments, the navigation system 100 may acquire navigation information that includes inertial motion information. The navigation system 100 may include navigation sensors 113 that provide inertial motion information to the navigation computer 101. The navigation sensors 113 sense and measure the inertial motion of the object mounted to the navigation system 100. For example, the navigation sensors 113 may include gyroscopes that measure rotation and accelerometers that measure acceleration. Further, the navigation sensors 113 may be an inertial navigation system (INS) that receives raw inertial data from combinations of gyroscopes and accelerometers and calculates an inertial navigation solution. The INS then provides the inertial navigation solution to the navigation computer 101. Alternatively, the navigation sensors 113 may provide raw inertial data to the navigation computer 101 for further processing.

In further embodiments, the navigation system 100 includes additional sensors that provide data to the navigation computer 101, where the navigation computer 101 uses the additional data to enhance computed navigation solutions. For example, the navigation system 100 includes one or more aiding sensors 111. The one or more aiding sensors 111 may include a vertical position sensor such as an altimeter. Also, the one or more aiding sensors 111 may include electro-optical sensors, barometric sensors, velocimeters, and other types of sensors.

In certain embodiments, the navigation system 100 may use GNSS measurements when calculating navigation information. To this end, the navigation system 100 may include a GNSS receiver 115 coupled to an associated antenna 117. The GNSS receiver 115 receives satellite signals from multiple GNSS satellites that are observable through the associated antenna 117. The GNSS receiver 115 provides GNSS measurements, based on the received signals, to the navigation computer 101, where the navigation computer 101 uses the GNSS measurements to calculate position information. However, as the GNSS measurements rely on receiving signals from external sources, GNSS measurements can be unavailable when the navigation system 100 is in a GNSS-denied or GNSS-contested environment.

When the navigation system 100 cannot receive GNSS measurements, the navigation system 100 calculates the navigation solution using the navigation sensors 113 and aiding sensors 111. However, the navigation sensors 113 and aiding sensors 111 are subject to various sources of errors. For example, because inertial navigation solutions rely on dead-reckoning, small errors accumulate over time. Thus, measurements calculated using inertial data from the navigation sensors 113 may drift over time. Further, different aiding sensors 111 may each experience various errors. For example, vision-based sensors may have visibility limitations and limitations related to available visible features, terrain-based systems may have limitations caused by large elevation variations, and gravitational anomaly systems are large and expensive.

In certain embodiments, to address limitations related to GNSS signal reception and the one or more aiding sensors 111 described above, the navigation system 100 acquires additional navigation information from magnetometers 109 that make part of the navigation system 100. The magnetometers 109 may include a magnetic gradient sensor 121 to measure the magnetic gradient and a magnetic field sensor 119 to measure the magnetic field at their respective locations on the moving object associated with the navigation system 100. Concerning the magnetic gradient sensor 121, the magnetometers 109 may be located at different locations on the moving object to measure the magnetic gradient over the area spanned by the different magnetometers 109. Concerning the magnetic field sensor 119, the magnetometers 109 may include a separate magnetometer 109 to provide an additional magnetic field measurement, where the separate magnetometer 109 differs from the magnetometers 109 used to provide the magnetic gradient measurements. Alternatively, one of the magnetometers 109 in the magnetic gradient sensor 121 provides an additional magnetic field measurement and functions as the magnetic field sensor 119. The magnetometers 109 may provide magnetic gradient and magnetic field measurements to the processor 103. The processor 103 uses the magnetic gradient measurements and the magnetic field measurements to reduce position drift and bound velocity errors.

In some embodiments, the processor 103 bounds the velocity errors and reduces drift by calculating an estimated magnetic field using a measured magnetic gradient, a velocity measurement from the navigation sensors 113, and an initial measurement of the magnetic field from the magnetometers 109. For example, the processor 103 receives an initial measurement of the magnetic field from one or more of the magnetometers 109. After the passing of a period of time, the processor 103 receives additional measurements from the magnetometers 109 and the navigation sensors 113. The processor 103 uses the additional measurements to estimate a magnetic field based on the measured magnetic gradient and inertial measurements from the navigation sensors 113 and potentially additional measurements from the one or more aiding sensors 111. The processor 103 may provide the estimated magnetic field and a measured magnetic field as inputs for a statistical filter. As used herein, a statistical filter refers to an algorithm that estimates state variables based on a series of measurements acquired over time. Regarding the navigation system 100, the statistical filter uses the estimated magnetic field as a predicted value and a measured magnetic field as an update value to update other navigation parameters for the navigation system 100. The updated navigation parameters may include an estimate of the error in the navigation estimates. The processor 103 then applies the calculated error to the navigation estimates to calculate a navigation solution. For example, the processor 103 executes computer instructions that direct the processor 103 to implement a statistical filter such as an extended Kalman filter, a Kalman filter, or other estimation algorithm.

In some embodiments, the processor 103 calculates the estimated magnetic field using a velocity estimate from the navigation solution (which is estimated either in part or entirely from the inertial sensor data) and the measured magnetic gradient from the magnetometers 109. When the processor 103 uses the measured magnetic field to update the estimated error in the navigation estimates, the measured magnetic field functions as a bound for the error in velocity. Also, as the velocity measurements are used to calculate position measurements, the measured magnetic field can slow the drift in position measurements.

In some embodiments, the memory storage device 105 may store a magnetic anomaly map. While the processor 103 may acquire position information from the magnetometers 109 without the use of a map, when available, the processor 103 may use the magnetic anomaly map to identify a position of the navigation system 100 within the area described by the magnetic anomaly map based on the measurements acquired from the magnetometers 109. For example, the processor 103 may calculate the magnetic gradient and magnetic field measurement at a current location of the navigation system 100 and then identify a position on the magnetic anomaly map having the calculated magnetic gradient and magnetic field measurement. The magnetic anomaly map information can provide additional information that can help limit the drift in position but is unnecessary to bound velocity errors and reduce position drift.

The processor 103 and/or other computing devices used in the navigation system 100, other computing devices in communication with the navigation system 100, and other systems and methods described herein may be implemented using software, firmware, hardware, or appropriate combinations thereof. The processor 103 and other computing devices may be supplemented by, or incorporated in, specially designed application-specific integrated circuits (ASICs) or field programmable gate arrays (FPGAs). In some implementations, the processor 103 and other computing devices may communicate through an additional transceiver with other computing devices outside of the navigation system 100. The processor 103 and other computing devices may also include or function with software programs, firmware, or other computer-readable instructions for carrying out various process tasks, calculations, and control functions used in the methods and systems described herein.

The methods described herein may be implemented by computer-readable instructions, such as program modules or components, executed by at least one processor, such as the processor 103. Upon execution, the computer-readable instructions direct the processor 103 to perform different tasks. Generally, program modules include routines, programs, objects, data components, data structures, algorithms, and the like which perform particular tasks or implement particular abstract data types.

Instructions for carrying out the various process tasks, calculations, and generation of other data used in the operation of the methods described herein can be implemented in software, firmware, or other computer-readable instructions. These instructions are typically stored on appropriate computer program products that include computer-readable media used to store computer readable instructions or data structures. Such a computer-readable medium may be available media that can be accessed by a general-purpose or special-purpose computer or processor, or any programmable logic device. For instance, the memory storage device 105 may be an example of a computer-readable medium capable of storing computer-readable instructions and/or data structures. The memory storage device 105 may also store navigation information such as maps, terrain databases, magnetic field information, path data, and other navigation information.

Suitable computer-readable storage media (such as the memory storage device 105) may include, for example, non-volatile memory devices including semiconductor memory devices such as Random Access Memory (RAM), Read Only Memory (ROM), Electrically Erasable Programmable ROM (EEPROM), or flash memory devices; magnetic disks such as internal hard disks or removable disks; optical storage devices such as compact discs (CDs), digital versatile discs (DVDs), Blu-ray discs; or any other media that can be used to carry or store desired program code in the form of computer-executable instructions or data structures.

Figure 2:
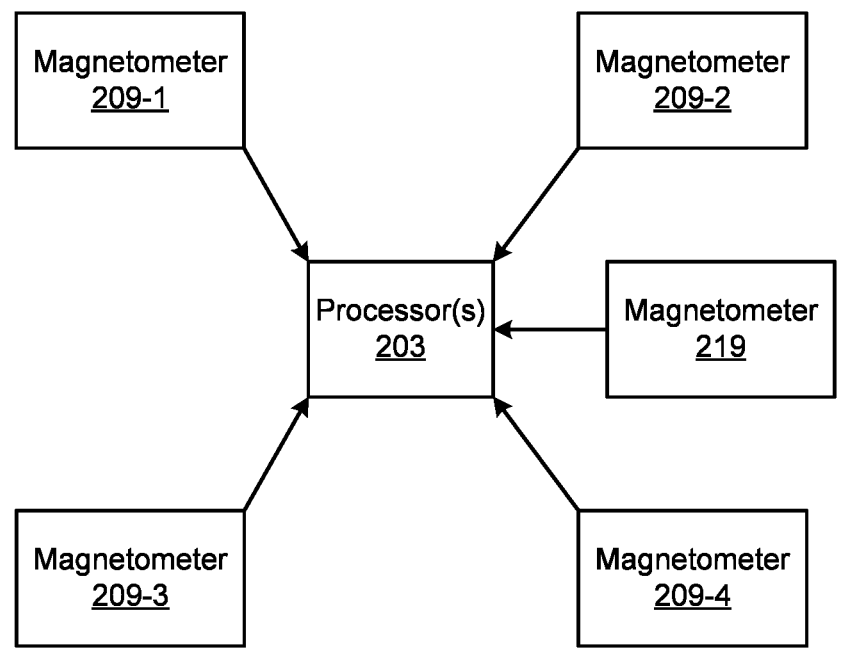
FIG. 2 is a block diagram illustrating multiple magnetometers used for providing navigation information according to an aspect of the present disclosure.

FIG. 2 is a block diagram illustrating multiple magnetometers in communication with the processor 203. As shown, the processor 203 may function substantially similar to the processor 103 of FIG. 1. The magnetometers 209-1, 209-2, 209-3, 209-4, and 219 may function substantially similar to the magnetometers 109 of FIG. 1. For example, the magnetometers 209-1, 209-2, 209-3. and 209-4 (referred to collectively and generally as magnetometers 209-1-209-4) may provide magnetic field measurements to the processor 203 used to calculate a magnetic gradient. In some implementations, the navigation system 100 may include an additional magnetometer 219 that provides magnetic field measurements besides those used by the processor 203 to calculate the magnetic field gradient.

In certain embodiments, the processor 203 may use magnetic gradient measurements and magnetic field measurements to reduce the drift of position and bound velocity and other navigation errors. The processor 203 acquires the measurements by receiving magnetic field measurements from four or more magnetometers 209-1-209-4 securely located at different locations on the object associated with the navigation system 100. Additionally, the processor 203 receives information about the orientation and location of the magnetometers 209-1-209-4 in relation to a reference frame for the navigating object. The processor 203 may use the magnetic field measurements from the four or more magnetometers 209-1-209-4 and the information about the position and orientation of each magnetometer 209-1-209-4 in relation to the navigating object (and to each other) to calculate a magnetic field gradient for the area spanned by the four or more magnetometers 209-1-209-4. For example, a first magnetometer 209-1, a second magnetometer 209-2, a third magnetometer 209-3, and a fourth magnetometer 209-4 may be at respective first, second, third, and fourth locations. The processor 203 may use the measurements acquired from the first magnetometer 209-1, the second magnetometer 209-2, the third magnetometer 209-3, and the fourth magnetometer 209-4 to calculate a magnetic gradient associated with the area bounded by the first, second, and third locations.

The processor 203 may periodically receive a magnetic field measurement at a location associated with the measured magnetic gradient from either an additional magnetometer 219 or from one of the four or more magnetometers 209-1-209-4. As described above and in greater detail below, the processor 203 estimates a magnetic field using inertial measurements and the measured magnetic gradient. The processor 203 implements a Kalman filter to update the estimated magnetic field with a measured magnetic field. For example, the processor 203 may use the measurement from the additional magnetometer 219 as an input to the Kalman filter to update the estimated magnetic field. When the estimated magnetic field is updated, the measured magnetic field may bound the velocity errors while reducing the drift in position calculations.

Alternatively, the processor 203 may periodically receive a magnetic field measurement at a location associated with the measured magnetic gradient from either an additional magnetometer 219 or from one of the four or more magnetometers 209-1-209-4. The processor 203 may use subsequently received magnetic field measurements to acquire position information. For example, the processor 203 may calculate a difference in measured magnetic fields between subsequently acquired magnetic field measurements and calculate a change in position using the calculated difference and the measured magnetic gradients associated with the subsequently acquired magnetic fields.

In some embodiments, the magnetometers 209-1-209-4 and 219 may be vector magnetometers, scalar magnetometers, or a combination of vector and scalar magnetometers. Each of the magnetometers 209-1-209-4 and 219 may measure magnetic fields in one, two, or three dimensions. Further, some of the magnetometers 209-1-209-4 and 219 may be composed of multiple magnetometers that measure magnetic fields along one or two axes, such that the magnetometers 209-1-209-4 and 219 may provide measurements along three axes. The magnetometers 209-1-209-4 and 219 may be any type of magnetometer capable of measuring magnetic fields. Examples of vector and scalar magnetometers may include SQUID magnetometers, Hall effect magnetometers, potassium vapor magnetometers, cesium vapor magnetometers, fluxgate magnetometers, magnetoresistive devices, spin-exchange relaxation-free atomic magnetometers, nitrogen-vacancy magnetometers, and the like. In further embodiments, when a system that includes the magnetometers 209-1-209-4 and 219 is fabricated, the magnetometers 209-1-209-4 and 219 may be calibrated using various methods associated with the type of magnetometer being calibrated.

Figure 3:
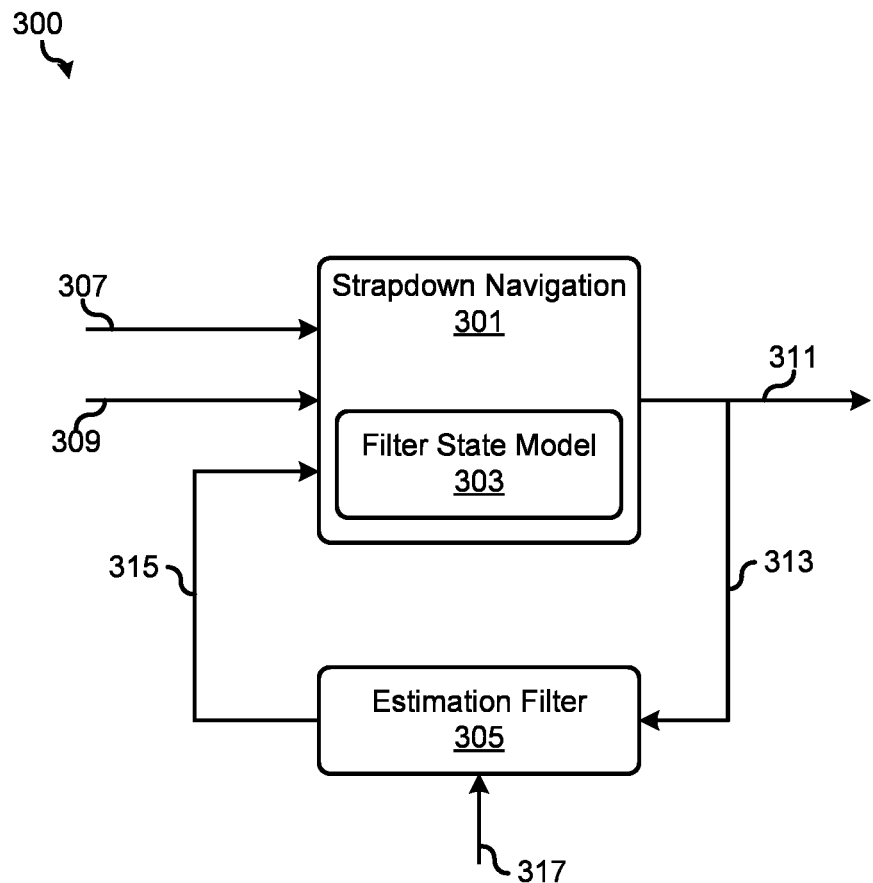
FIG. 3 is a block diagram illustrating an exemplary implementation for calculating navigation solutions using magnetic field and gradient measurements according to an aspect of the present disclosure.

FIG. 3 is a block diagram illustrating a system 300 for calculating a navigation solution 311 using magnetic field and gradient measurements. The system 300 may be executed by a processor, like the processor 103 in FIG. 1, that executes various algorithms for calculating a navigation solution 311. The system 300 may receive various inputs from sensors that may include inertial measurements 307 and magnetic gradient measurements 309. The inertial measurements 307 may be produced by inertial sensors, such as the navigation sensors 113 in FIG. 1. The magnetic gradient measurements 309 may be produced from measurements by magnetometers, such as the magnetometers 209-1-209-4 in FIG. 2.

In certain embodiments, the system 300 executes an algorithm for strapdown navigation 301. The strapdown navigation 301 uses measurements from sensors attached to the body of a navigating object to calculate various navigation parameters. For example, using the inertial measurements 307 and the magnetic gradient measurements 309, the strapdown navigation 301 estimates navigation parameters that include a position $\hat{P}$, velocity $\hat{V}$, attitude $\hat{\Phi}$, and magnetic field $\hat{\zeta}$. In certain embodiments, the strapdown navigation 301 calculates an estimate of the magnetic field by multiplying the measured magnetic gradient by the measured velocity as follows:

$$\dot{\hat{\zeta}}(t) = \zeta_{meas}'(t)\hat{V}(t).$$

The equation above does not indicate the coordinate frames of the estimated parameters. However, those skilled in the art may note that the magnetic field gradient and estimated velocity are, in general, vector quantities and are represented with consistent coordinate frames. A processor may use the attitude estimate from the navigation solution to transform coordinate frames. Further, the processor may account for attitude errors and uncertainties in the measurement equation and the estimation filter. Example coordinate frames include but are not limited to the sensor frame, the body frame, the navigation frame, the inertial frame, the local-level frame, and the earth-centered earth-fixed (ECEF) frame.

In some embodiments, a processor represents the estimate of the magnetic field in the ECEF frame or the local-level frame. The processor receives the magnetic gradient measurement in the magnetic sensor frame and converts the magnetic gradient measurement into the ECEF frame or the local-level frame using attitude and position information. The velocity estimate may be in the ECEF frame or the local-level frame. The processor estimates the velocity in part or entirely from the inertial sensor data taken in the inertial sensor frame and is transformed into the local-level or ECEF frame with attitude and position information. Additional information used for coordinate frame transformations will be apparent to those skilled in the art and may include but is not limited to sensor lever arms and sensor-to-body frame alignment information.

The strapdown navigation 301 may also maintain a filter state model 303. The filter state model 303 tracks an estimate of the error in the navigation parameters and the relationship between the navigation parameters. For example, the filter state model 303 may include an error estimate for the position $\delta \hat{P}$, velocity $\delta \hat{V}$, attitude $\delta \hat{\Phi}$, magnetic field of $\delta \hat{\zeta}$, and the distance traveled $\delta s$. The filter state model may also include adjusted measurements and other information associated with the state of the moving object. When storing the error estimates of the navigation parameters, the filter state model 303 stores accumulated errors over an operational period. Alternatively, the filter state model 303 stores an estimated error representing the most recent update of the estimated parameters using the estimated errors based on the inertial measurements 307 and the magnetic gradient measurements 309. When the errors in the filter state model 303 are used to update the estimated parameters provided as part of a navigation solution 311, the errors in the filter state model 303 are cleared.

The strapdown navigation 301 provides the navigation solution 311 for use by another system. The navigation solution 311 may provide the position, velocity, and attitude of a moving object for use by other systems and applications connected to the navigation system. Also, the strapdown navigation 301 may provide data 313 to an estimation filter 305. For example, the strapdown navigation 301 may provide the navigation solution 311 as part of the data 313 to the estimation filter 305. The data 313 provided by the strapdown navigation 301 also includes the filter state model 303 and an a priori state estimate for the navigation parameters. The estimation filter 305 may implement a statistical filter for updating the filter state model 303.

In certain embodiments, the estimation filter 305 receives measurements from aiding sources and uses the measurements to update the a priori state estimate and the filter state model 303. For example, the estimation filter 305 receives a magnetic field measurement $\zeta_{meas}$ from a magnetometer.

The magnetometer can be one of the magnetometers used to provide a magnetic field gradient measurement like the magnetometers 209-1-209-4 in FIG. 2 or a separate magnetometer like the magnetometer 219 in FIG. 2. The estimation filter 305 solves the equation y=h(x) to identify changes to the filter state model 303. For example, y=$\zeta_{meas}$ and h(x) =$\hat{\zeta}$-$\delta\hat{\zeta}$. As the a priori state estimate includes a magnetic field estimate, the equations can be used to solve for updated state estimates, which include an updated magnetic field error $\delta\hat{\zeta}$, an updated velocity error $\delta\hat{V}$, and an updated position error $\delta\hat{P}$. The estimation filter 305 then provides the updated state estimates as a posteriori state estimates 315 to the strapdown navigation 301. The strapdown navigation 301 may apply the a posteriori state estimate 315 from the updated filter state model 303 to improve the provided navigation solution.

In exemplary embodiments, providing the a posteriori state estimate 315 to the strapdown navigation 301 allows the acquisition of magnetic field measurements by the estimation filter 305 to function as a bound for the estimated velocity because the estimated magnetic field is calculated using the estimated velocity, which makes velocity an observable quantity in the estimation filter. Also, because the magnetic field measurements are a bound for the estimated velocity, the magnetic field measurements can reduce the drift in position. Accordingly, the magnetic measurements can improve the provided navigation solution 311 without using a magnetic anomaly map.

Figure 4:
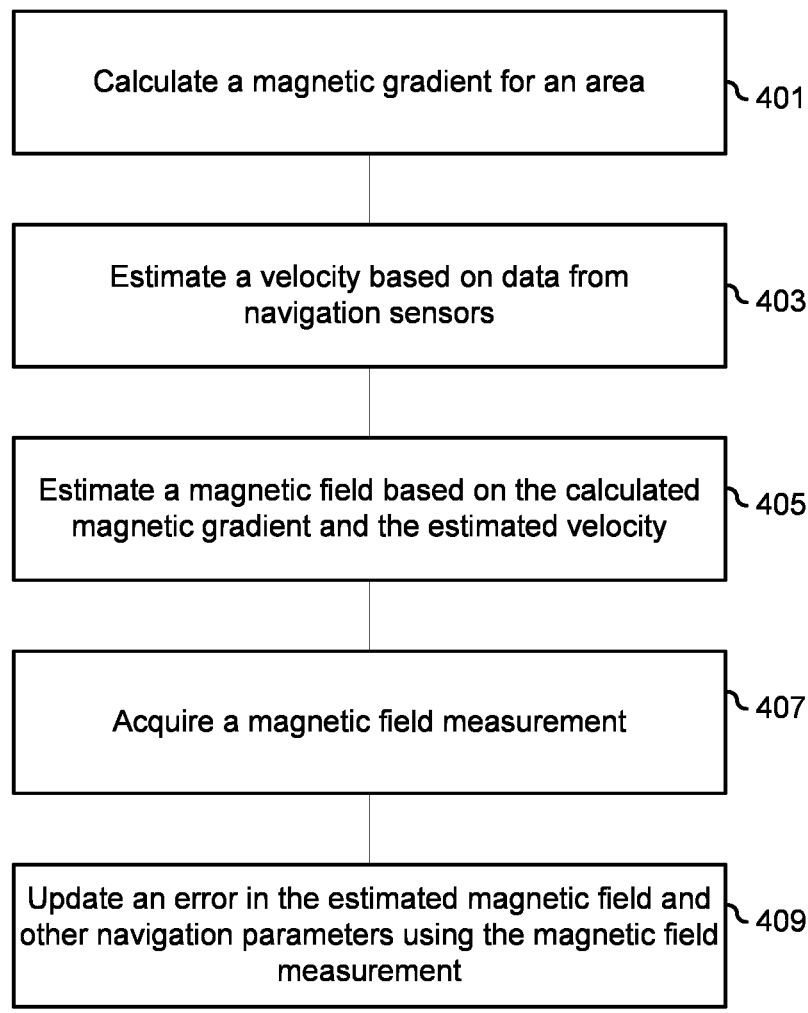
FIG. 4 is a flowchart diagram illustrating an exemplary method for performing navigation with a magnetometer and magnetic gradient sensor according to an aspect of the present disclosure.

FIG. 4 is a flowchart diagram of a method 400 for calculating position information using magnetic gradient and magnetometer measurements. In certain embodiments, the method 400 proceeds at 401, where a magnetic gradient for an area is calculated. Further, the method 400 proceeds at 403, where a velocity measurement is estimated based on data from navigation sensors. Also, the method 400 proceeds at 405, where a magnetic field is estimated based on the calculated magnetic gradient and the estimated velocity. Moreover, the method 400 proceeds at 407, where a magnetic field measurement is acquired from, for example, a magnetometer. Further, the method 400 proceeds at 409, where an error in the estimated magnetic field and other navigation parameters are updated using the magnetic field measurement, which drives corrections in the estimated position and velocity.

The estimation filter may take many forms, including but not limited to a Kalman Filter, Extended Kalman Filter, Unscented Kalman Filter, or Particle Filter. It will be appreciated by those skilled in the art that knowledge of the filter state model and the measurement equation functions as a component for implementing estimation algorithms.

EXAMPLE EMBODIMENTS

Example 1 includes a system comprising: a magnetic gradient sensor that measures a magnetic gradient; one or more inertial sensors that provide inertial measurements; a magnetic field sensor that measures magnetic fields; and one or more processors that execute computer-readable instructions that direct the one or more processors to: estimate a magnetic field based on the measured magnetic gradient and a velocity estimate from the inertial measurements; and calculate an error for the magnetic field and other navigation parameters using an additional magnetic field measurement from the magnetic field sensor.

Example 2 includes the system of Example 1, wherein the magnetic gradient sensor uses a magnetic field measurement from the magnetic field sensor to measure the magnetic gradient.

Example 3 includes the system of Example 1, wherein the error of the other navigation parameters includes an update of an error for the velocity estimate based on the additional magnetic field measurement.

Example 4 includes the system of Example 1, wherein the computer-readable instructions further direct the one or more processors to use a statistical filter to calculate the error.

Example 5 includes the system of Example 4, wherein the statistical filter receives the estimated magnetic field as a predicted value and the additional magnetic field measurement as an update value.

Example 6 includes the system of Example 1, wherein the computer-readable instructions further direct the one or more processors to identify a location on a magnetic anomaly map using the estimated magnetic field and the calculated error for the magnetic field.

Example 7 includes the system of Example 1, wherein the computer-readable instructions further direct the one or more processors to convert a reference frame of the measured magnetic fields and the measured magnetic gradient based on a navigation solution.

Example 8 includes the system of Example 1, wherein the computer-readable instructions further direct the one or more processors to calculate the velocity estimate based on the measured magnetic fields and the measured magnetic gradient.

Example 9 includes a method comprising: calculating a magnetic gradient for an area based on measurements received from a plurality of magnetometers; estimating a velocity based on data from navigation sensors; estimating a magnetic field based on the calculated magnetic gradient and the estimated velocity; acquiring a magnetic field measurement from a magnetometer in the plurality of magnetometers; and updating an error in the estimated magnetic field and other navigation parameters using the magnetic field measurement.

Example 10 includes the method of Example 9, wherein the magnetometer that acquires the magnetic field measurement is separate from one or more magnetometers used to measure the magnetic gradient in the plurality of magnetometers.

Example 11 includes the method of any of Examples 9-10, wherein the error of the other navigation parameters includes an update of an error for the estimated velocity based on the acquired magnetic field measurement.

Example 12 includes the method of any of Examples 9-11, wherein updating the error comprises using a statistical filter to update the error.

Example 13 includes the method of Example 12, further comprising receiving the estimated magnetic field as a predicted value and the acquired magnetic field measurement as an update value as inputs for the statistical filter.

Example 14 includes the method of any of Examples 9-13, further comprising identifying a location on a magnetic anomaly map using the estimated magnetic field and the updated error for the estimated magnetic field.

Example 15 includes the method of any of Examples 9-14, further comprising converting a reference frame of the acquired magnetic field measurement and the calculated magnetic gradient based on a navigation solution, wherein the navigation solution is calculated based on the updated error in the estimated magnetic field and the other navigation parameters.

Example 16 includes the method of any of Examples 9-15, further comprising calculating a velocity estimate based the acquired magnetic field measurement and calculated magnetic gradient.

Example 17 includes a system comprising: a plurality of magnetometers that measure magnetic gradients and magnetic fields; one or more inertial sensors that provide inertial measurements of a moving object; and one or more processors that execute computer-readable instructions that direct the one or more processors to: estimate a magnetic field based on a measured magnetic gradient and a velocity estimate from the inertial measurements; calculate an error for the magnetic field and other navigation parameters using an additional magnetic field measurement from a magnetometer in the plurality of magnetometers; and update the error for the velocity estimate based on the additional magnetic field measurement.

Example 18 includes the system of Example 17, wherein the computer-readable instructions further direct the one or more processors to calculate a navigation solution for the moving object based on the calculated error for the magnetic field and the other navigation parameters.

Example 19 includes the system of any of Examples 17-18, wherein the computer-readable instructions further direct the one or more processors to use a statistical filter to calculate the error, wherein the statistical filter receives the estimated magnetic field as a predicted value and the additional magnetic field measurement as an update value.

Example 20 includes the system of any of Examples 17-19, wherein the computer-readable instructions further direct the one or more processors to calculate the velocity estimate based on the measured magnetic field and the measured magnetic gradient.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A system comprising:
   a magnetic gradient sensor that measures a magnetic gradient;
   one or more inertial sensors that provide inertial measurements;
   a magnetic field sensor that measures magnetic fields; and
   one or more processors that execute computer-readable instructions that direct the one or more processors to:
      estimate magnetic field variation over time by multiplying the measured magnetic gradient by a velocity estimate from the inertial measurements;
      calculate a difference between the estimated magnetic field variation and a measured magnetic field from the magnetic field sensor; and
      update an error for the magnetic field and other navigation parameters using the calculated difference, wherein the other navigation parameters include the velocity estimate and the update drives corrections in an estimated position and the velocity estimate of a moving object.

2. The system of claim 1, wherein the magnetic gradient sensor uses a magnetic field measurement from the magnetic field sensor to measure the magnetic gradient.

3. The system of claim 1, wherein the computer-readable instructions further direct the one or more processors to use a statistical filter to calculate the error.

4. The system of claim 3, wherein the statistical filter receives the estimated magnetic field as a predicted value and the additional magnetic field measurement as an update value.

5. The system of claim 1, wherein the computer-readable instructions further direct the one or more processors to identify a location on a magnetic anomaly map using the estimated magnetic field and the calculated error for the magnetic field.

6. The system of claim 1, wherein the computer-readable instructions further direct the one or more processors to convert a reference frame of the measured magnetic fields and the measured magnetic gradient based on a navigation solution.

7. The system of claim 1, wherein the computer-readable instructions further direct the one or more processors to calculate the velocity estimate based on the measured magnetic fields and the measured magnetic gradient.

8. A method comprising:
   calculating a magnetic gradient for an area based on measurements received from a plurality of magnetometers;
   estimating a velocity based on data from navigation sensors;
   estimating a magnetic field variation over time by multiplying the calculated magnetic gradient by the estimated velocity;
   acquiring a magnetic field measurement from a magnetometer in the plurality of magnetometers;
   calculating a difference between the estimated magnetic field variation and the acquired magnetic field measurement; and
   updating an error in the estimated magnetic field and other navigation parameters using the calculated difference, wherein the other navigation parameters include the estimated velocity and the updated error drives corrections in an estimated position and the estimated velocity of a moving object.

9. The method of claim 8, wherein the magnetometer that acquires the magnetic field measurement is separate from one or more magnetometers used to measure the magnetic gradient in the plurality of magnetometers.

10. The method of claim 8, wherein updating the error comprises using a statistical filter to update the error.

11. The method of claim 10, further comprising receiving the estimated magnetic field as a predicted value and the acquired magnetic field measurement as an update value as inputs for the statistical filter.

12. The method of claim 8, further comprising identifying a location on a magnetic anomaly map using the estimated magnetic field and the updated error for the estimated magnetic field.

13. The method of claim 8, further comprising converting a reference frame of the acquired magnetic field measurement and the calculated magnetic gradient based on a navigation solution, wherein the navigation solution is calculated based on the updated error in the estimated magnetic field and the other navigation parameters.

14. The method of claim 8, further comprising calculating a velocity estimate based on the acquired magnetic field measurement and calculated magnetic gradient.

15. A system comprising:
   a plurality of magnetometers that measure magnetic gradients and magnetic fields;

one or more inertial sensors that provide inertial measurements of a moving object; and one or more processors that execute computer-readable instructions that direct the one or more processors to:

estimate a magnetic field variation by multiplying a measured magnetic gradient by a velocity estimate from the inertial measurements;

calculate an error for the magnetic field and other navigation parameters using a difference between an additional magnetic field measurement from a magnetometer in the plurality of magnetometers and the estimated magnetic field variation, wherein the other navigation parameters include the velocity estimate; and update the error for the velocity estimate based on the difference, wherein the update drives corrections in an estimated position and the velocity estimate of the moving object.

16. The system of claim 15, wherein the computer-readable instructions further direct the one or more processors to calculate a navigation solution for the moving object based on the calculated error for the magnetic field and the other navigation parameters.

17. The system of claim 15, wherein the computer-readable instructions further direct the one or more processors to use a statistical filter to calculate the error, wherein the statistical filter receives the estimated magnetic field as a predicted value and the additional magnetic field measurement as an update value.

18. The system of claim 15, wherein the computer-readable instructions further direct the one or more processors to calculate the velocity estimate based on the measured magnetic field and the measured magnetic gradient.

* * * * *

UNITED STATES PATENT AND TRADEMARK OFFICE
CERTIFICATE OF CORRECTION

| | | |
|---|---|---|
| PATENT NO. | : 12,078,486 B1 | Page 1 of 1 |
| APPLICATION NO. | : 17/443632 | |
| DATED | : September 3, 2024 | |
| INVENTOR(S) | : Keyes | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 169 days.

Signed and Sealed this
Thirty-first Day of December, 2024

Derrick Brent
*Acting Director of the United States Patent and Trademark Office*